United States Patent
Kawashima et al.

(10) Patent No.: US 7,400,199 B2
(45) Date of Patent: Jul. 15, 2008

(54) SEMICONDUCTOR INTEGRATED CIRCUIT APPARATUS

(75) Inventors: Katsuhiko Kawashima, Nishinomiya (JP); Kazuki Tateoka, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 107 days.

(21) Appl. No.: 11/236,582

(22) Filed: Sep. 28, 2005

(65) Prior Publication Data

US 2006/0176117 A1  Aug. 10, 2006

(30) Foreign Application Priority Data

Feb. 7, 2005 (JP) ............... 2005-030265

(51) Int. Cl.
*H03F 3/68* (2006.01)
(52) U.S. Cl. ...................................... 330/295
(58) Field of Classification Search ........................ None
See application file for complete search history.

(56) References Cited

U.S. PATENT DOCUMENTS 5,760,456 A * 6/1998 Grzegorek et al. .......... 257/531
6,028,348 A * 2/2000 Hill ............................. 257/666
6,804,500 B2 * 10/2004 Yamaguchi ................. 455/127.1
7,276,975 B2 * 10/2007 Tateoka et al. .............. 330/302

FOREIGN PATENT DOCUMENTS

JP  2001-196865 A  7/2001

* cited by examiner

*Primary Examiner*—Robert J. Pascal
*Assistant Examiner*—Alan Wong
(74) *Attorney, Agent, or Firm*—McDermott Will & Emery LLP

(57) ABSTRACT

A capacitor 12 is formed by laminating a lower electrode 12*b*, a dielectric 12*e* and an upper electrode 12*t* in this order. An inductor 14 is formed as a thin metal wiring of a spiral shape so as to have an inductor component. The inductor 14 is formed in the same wiring layer and of the same metal material as the lower electrode 12*b* of the capacitor 12 connected to a base electrode 11*b* of a transistor 11. The DC bias is inputted to the base B of the transistor 11 through the inductor 14 of a spiral shape from the DC bias supply wiring BP, and a radio frequency signal is inputted to the base B of the transistor 11 through the capacitor 12.

7 Claims, 6 Drawing Sheets

SEMICONDUCTOR INTEGRATED CIRCUIT APPARATUS

BACKGROUND OF THE INVENTION

1. Field of the Invention

The present invention relates to a semiconductor integrated circuit apparatus, and more particularly to an apparatus having, integrated on a semiconductor substrate, an active element such as a transistor and a passive element such as a capacitor, the apparatus being used for a signal transmitter of a wireless communication device such as a cellular phone using a radio frequency band.

2. Description of the Background Art

In general, in order to obtain a high output, a semiconductor integrated circuit apparatus for use in a radio frequency signal power amplifier is configured such that a plurality of transistors (for example, heterojunction bipolar transistor) having a superior radio frequency characteristic are connected in parallel with each other so as to combine outputs of the respective transistors. This configuration is disclosed in, for example, U.S. Pat. No. 5,608,353, U.S. Pat. No. 5,629,648, and Japanese Laid-Open Patent Publication No. 2001-196865. FIG. 6 is a diagram illustrating an example of a configuration of a conventional semiconductor integrated circuit apparatus 100 so configured. A semiconductor integrated circuit apparatus 100 shown in FIG. 6 is configured such that a plurality of cell circuits (circuits each enclosed by dotted lines in FIG. 6) each including a transistor 101, a capacitor 102 and a resistor 103 are connected in parallel with each other.

In FIG. 6, a DC bias supplied from a bias circuit (not shown) is supplied to a base B of each transistor 101 via each resistor 103. On the other hand, a radio frequency signal which is an AC signal is inputted to the base B of each transistor 101 via each capacitor 102. Thus, a DC bias and a radio frequency signal are inputted to the base B of the transistor 101 via different routes for the following reasons.

The transistor 101 generates a heat due to a current density of an AC current being increased during a high output operation. Such heat generation is not uniform among all the transistors 101 due to characteristic variations among the transistors 101 and the like. Therefore, a certain transistor 101 of a high temperature exhibits a thermal runaway due to a high heating value during operation, which may cause an element destruction due to an increased base current. Therefore, in order to suppress the thermal runaway, a resistor (base ballast resistor) 103 is serially connected to the base B of each transistor 101 so as to reduce base bias current supplied from the bias circuit when a base voltage is increased in the transistor 101. However, the resistor 103 causes a power gain reduction for a radio frequency signal. Therefore, a radio frequency signal is inputted to the base B of each transistor 101 via the capacitor 102.

However, in the conventional semiconductor integrated circuit apparatus 100 shown in FIG. 6 of the aforementioned configuration, a portion of radio frequency signals supplied to the base B of the transistor 101 via the capacitor 102 escapes into (leaks into) a bias circuit via the resistor 103. Therefore, there is a problem that the escape of the radio frequency signal causes an interference between a DC bias and a radio frequency signal, thereby generating a noise. That is, there is, for example, a problem that when a nose is generated from a power amplifier of a signal transmitter in a wireless communication device, the noise is detected in a signal receiver, which represents a quality degradation of a received signal.

SUMMARY OF THE INVENTION

Therefore, an object of the present invention is to provide a semiconductor integrated circuit apparatus for preventing a thermal runaway of a transistor and ensuring a high power gain while minimizing an escape of a radio frequency signal into a bias circuit.

The present invention is directed to a semiconductor integrated circuit apparatus having at least one cell circuit integrated on a semiconductor substrate. In order to attain the object mentioned above, a cell circuit comprising the semiconductor integrated circuit apparatus of the present invention includes at least one transistor, a capacitor, and an inductor. The capacitor has an electrode receiving an AC signal and has an other electrode connected to a base of the transistor. The inductor is formed of a spiral-shaped metal having two or more turns, and has a terminal to which a DC voltage is applied and has an other terminal connected to the base of the transistor.

The cell circuit may further include a second inductor formed of a spiral-shaped metal having two or more turns and having such a turn direction as to conform a magnetic field direction thereof to a magnetic field direction of the inductor, the magnetic fields generated when a current flows, the second inductor formed in a layer other than a layer in which the inductor is formed. Thereby, the inductor and the second inductor cooperate with each other to generate a mutual inductance.

Here, the inductor is preferably formed in a same process as is used for forming said another electrode using a same metal material as said another electrode of the capacitor. On the other hand, the second inductor is preferably formed in a same process as is used for forming the electrode using a same metal material as the electrode of the capacitor. Further, the inductor or the second inductor may be formed of a metal which is same as a metal of a collector electrode of the transistor.

When the cell circuit includes a plurality of transistors, said another electrode of the capacitor and said another terminal of the inductor are commonly connected to each base of the plurality of transistors.

The semiconductor integrated circuit apparatus of the present invention is capable of minimizing an amount of escape of an input radio frequency signal into a bias circuit. Thereby, a power amplifier having an improved noise characteristic can be easily realized. Further, a lower electrode of a capacitor and an inductor are able to be formed in the same process, so that a semiconductor area is able to be reduced since no contact area is provided for connecting between the capacitor and the inductor, as compared to a case where a capacitor is formed separately from an inductor.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
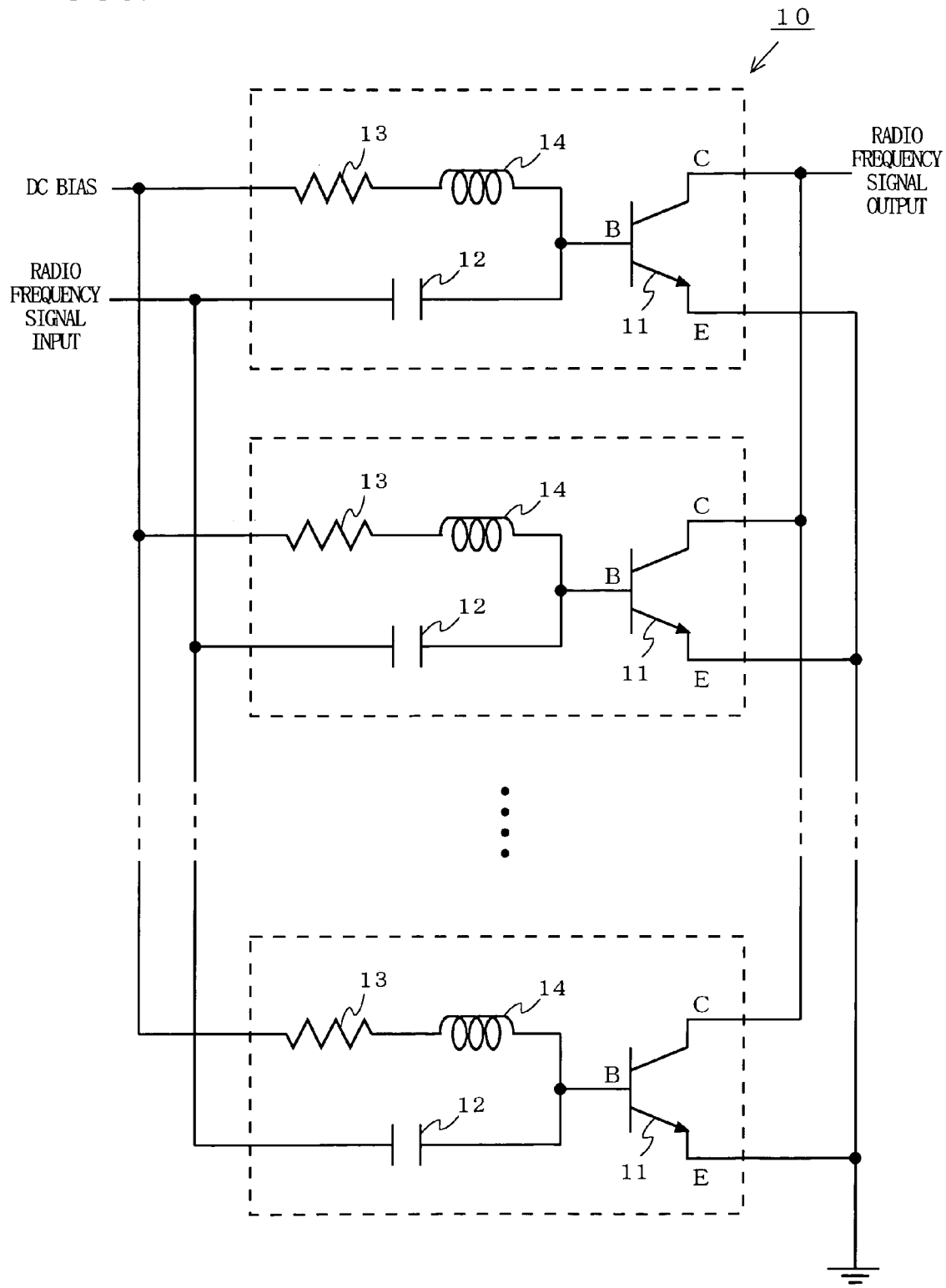
FIG. 1 is a diagram illustrating a configuration of a semiconductor integrated circuit apparatus 10 according to one embodiment of the present invention.

FIG. 1 is a diagram illustrating a configuration of a semiconductor integrated circuit apparatus 10 according to one embodiment of the present invention. In FIG. 1, the semiconductor integrated circuit apparatus 10 of the present embodiment is configured such that a plurality of cell circuits (circuits each enclosed by dotted lines in FIG. 1) each including a transistor 11, a capacitor 12, a resistor 13, and an inductor 14 are connected in parallel with each other.

In FIG. 1, a DC bias supplied from a bias circuit (not shown) is supplied to a base B of each transistor 11 via each resistor 13 and inductor 14. A radio frequency signal which is an AC signal is inputted via each capacitor 12 to the base B of each transistor 11, in which the radio frequency signal is amplified and outputted from a collector C of the transistor 11. An emitter E of each transistor 11 is grounded. The capacitor 12 and the resistor 13 are provided for the same reason as described in the background art.

As can be seen in FIG. 1, the semiconductor integrated circuit apparatus 10 of the present invention is characterized by a cell circuit configuration having the inductor 14 interposed between the base B of the transistor 11 and the resistor 13 and connected thereto. The inductor 14 has an impedance value which is obtained by multiplying a signal frequency by an inductor value. Therefore, the higher frequency the signal has, the higher resistance the inductor 14 has. Therefore, when an inductor value of the inductor 14 is appropriately set, an amount of escape of a radio frequency signal inputted via the capacitor 12 into the DC bias circuit can be minimized.

Figure 2:
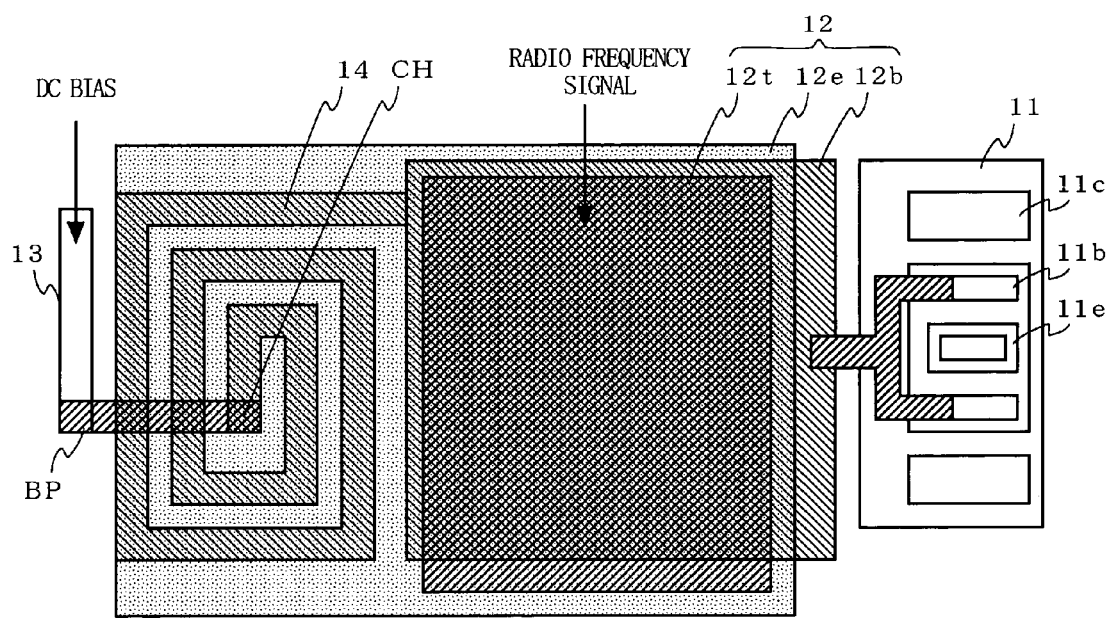
FIG. 2 is a diagram illustrating an example of a cell circuit of FIG. 1 formed on a semiconductor substrate.
Figure 2:
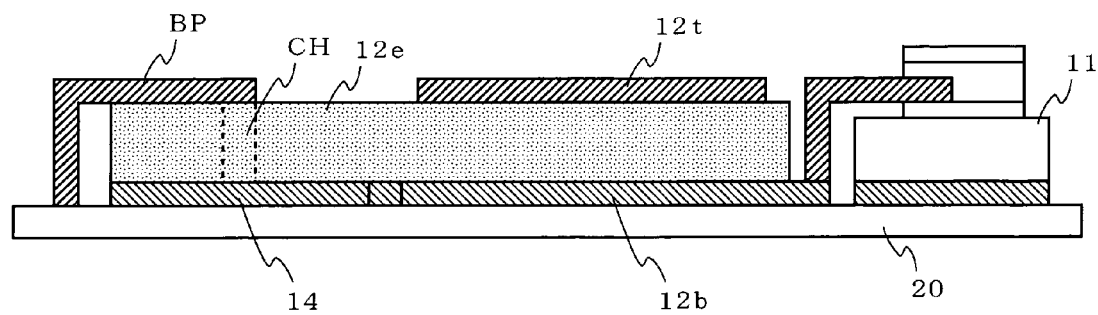
Figure 3:
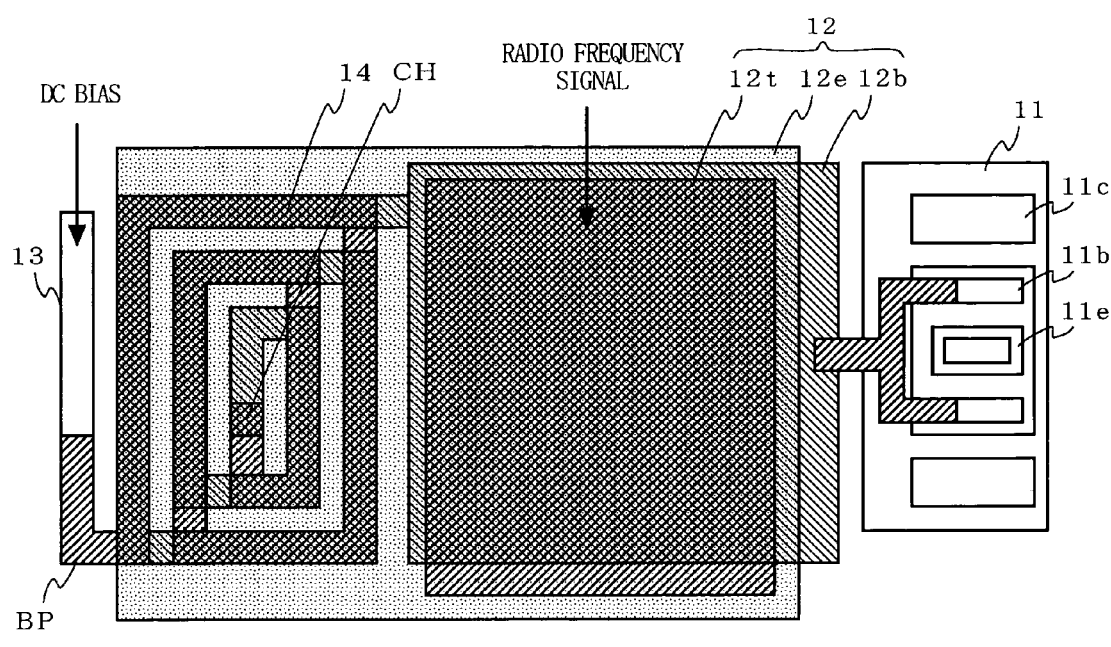
FIG. 3 is a diagram illustrating another example of a cell circuit of FIG. 1 formed on a semiconductor substrate.
Figure 3:
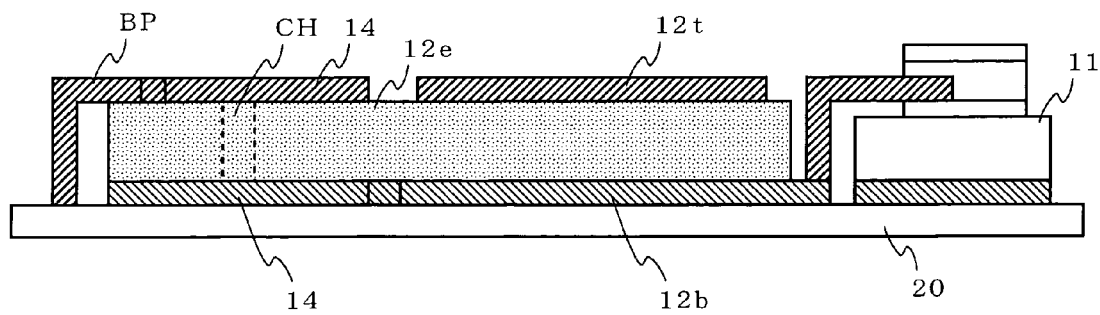
Figure 4A:
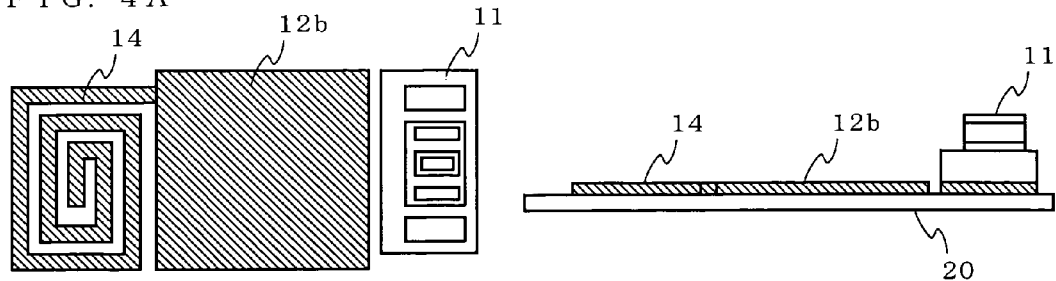
FIGS. 4A to 4D are diagrams for explaining a fabrication method for realizing the semiconductor integrated circuit apparatus 10 according to one embodiment of the present invention.
Figure 4B:
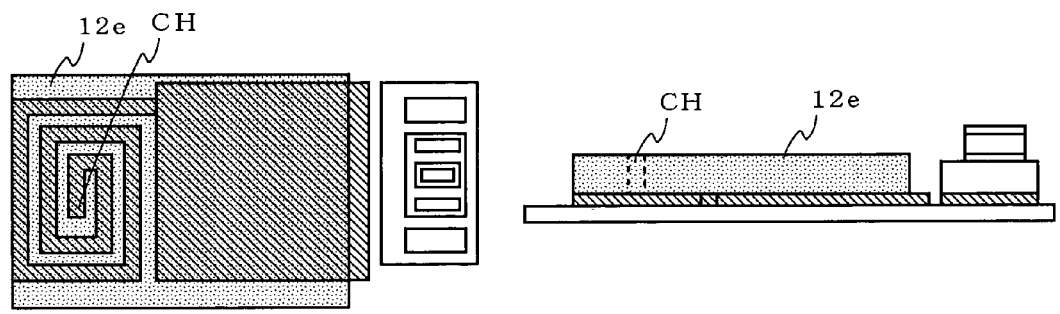
Figure 4C:
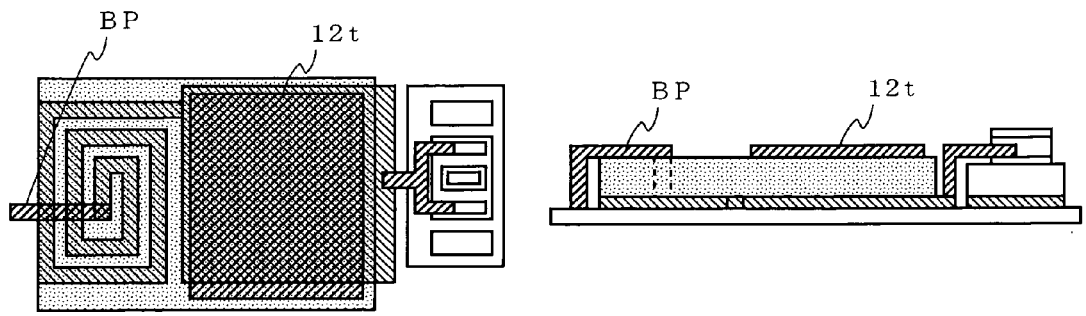
Figure 4D:
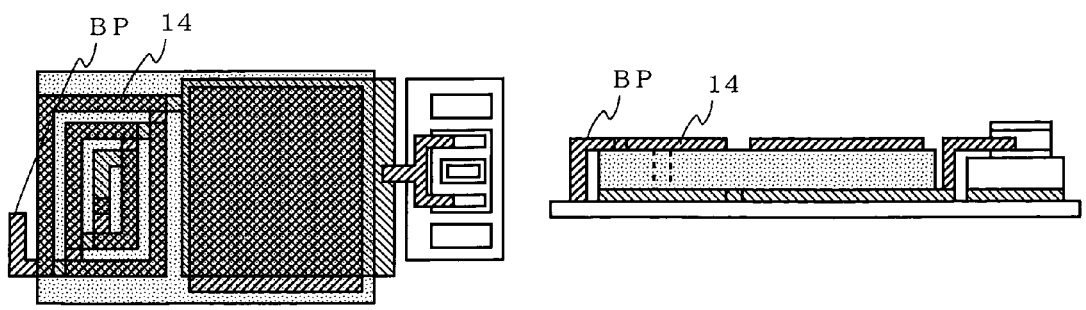

Further, in addition to the cell circuit configuration, the semiconductor integrated circuit apparatus 10 of the present invention is characterized by a configuration of the inductor 14 formed on the semiconductor substrate. Hereinafter, the configuration of the inductor 14 will be described in detail. FIG. 2 and FIG. 3 are a top view and a side view illustrating an example of the cell circuit of FIG. 1 formed on a semiconductor substrate, respectively. The top view is shown transparently so as to aid in easily understanding a lamination relationship.

In FIG. 2, the transistor 11 is formed on a semiconductor substrate 20 in a conventional method. The capacitor 12 is formed such that a lower electrode 12b, a dielectric 12e and an upper electrode 12t are laminated in this order. For example, the capacitor 12 is constructed such that the dielectric 12e formed of $Si_3N_4$ (silicon nitride) and the like and having a thickness of about 200 nm is interposed between the lower electrode 12b and the upper electrode 12t each of which is formed of Au (gold) and the like. The dielectric 12e also functions as an interlayer insulating film which electrically separates a layer in which the upper electrode 12t is formed from a layer in which the lower electrode 12b is formed. A radio frequency signal is inputted from the upper electrode 12t.

The inductor 14 is formed as a thin metal wiring of a spiral shape so as to have an inductor component. While the spiral shape may be arbitrarily designed according to an inductor value, the inductor 14 preferably has a spiral-shaped thin wiring having a width of about 2 μm and having two or more turns so as to function well as an inductor. In the present embodiment, one turn of a wiring refers to the wiring making one turn about a center of the spiral shape. The inductor 14 is formed in the same wiring layer and of the same metal material as an electrode of the capacitor 12, which electrode is connected to a base electrode 11b of the transistor 11. In an example shown in FIG. 2, the lower electrode 12b of the capacitor 12 is connected to the base electrode 11b of the transistor 11, and therefore the inductor 14 is formed in the same wiring layer and of the same metal material as the lower electrode 12b. Further, the inductor 14 has a contact hole CH provided at the center of the spiral shape thereof, the contact hole CH connected to a DC bias supply wiring BP to which a DC bias is applied.

Here, in a case where the inductor 14 has a spiral shape of increased turns, the inductor 14 may be constructed, as shown in FIG. 3, such that spiral-shaped wirings are formed on both wiring layer of the lower electrode 12b and wiring layer of the upper electrode 12t of the capacitor 12 so as to laminate the spiral-shaped wiring of the wiring layer of the upper electrode 12t on the spiral-shaped wiring of the wiring layer of the lower electrode 12b, thereby utilizing mutual inductance generated in this construction. As a condition required for this construction, a turn direction of the spiral shape of the lower layer wiring and a turn direction of the spiral shape of the upper layer wiring are determined such that a direction of a magnetic field generated in the spiral-shaped lower layer wiring conforms to a direction of a magnetic field generated in the spiral-shaped upper layer wiring when a DC current flows. When the inductor 14 such has a two-layered spiral shape configuration, that is, an upper and a lower layer spiral shapes, a high inductor value is able to be securely obtained with a reduced chip area. The spiral-shaped lower layer is electrically connected to the spiral-shaped upper layer through the contact hole CH. Further, a DC bias is applied to one end of the spiral-shaped upper layer through the DC bias supply wiring BP.

A fabrication method for realizing the semiconductor integrated circuit apparatus 10 of the aforementioned configuration will be described with reference to FIGS. 4A to 4D.

Firstly, the transistor 11 is formed on the semiconductor substrate 20. Further, the lower electrode 12b of the capacitor 12 is formed, using a patterning mask, through an Au-evaporation/lift-off process. In this case, the inductor 14 of a spiral shape is formed, through the same process, in an area other than an area in which the capacitor 12 is formed. This can be easily achieved by forming spiral-pattern and rectangular-pattern of the lower electrode 12b of the capacitor 12 using the same mask in photolithography patterning process (see FIG. 4A). A metal material for the lower electrode 12b of the capacitor 12 does not necessarily have to be Au. Depending on a type of a semiconductor process, the metal material for the lower electrode 12b of the capacitor 12 may be an alloy obtained by heat-treating Au and AuGeNi (an alloy of gold, germanium, and nickel) which is a metal material of the collector electrode 11c of the transistor 11. In this case, the fabrication method is further simplified, so that the formation process of the collector electrode 11c of the transistor 11, and the formation process of the lower electrode 12b of the capacitor 12 and the inductor 14 can be simultaneously executed.

Next, dielectric of $Si_3N_4$ is deposited so as to have a thickness of about 200 nm in a plasma CVD method, thereby forming the dielectric 12e of the capacitor 12. In this case, a layer of the dielectric 12e functions as a film for insulating, from the wiring layer in which the lower electrode 12b of the capacitor 12 is formed, the wiring layer in which the upper electrode 12t of the capacitor 12 is formed, in an area other than an area of the capacitor 12. Further, the contact hole CH between the wirings are formed in an area requiring the insulating film. See FIG. 4B.

In a case where the inductor 14 is formed of a single layer spiral shape shown in FIG. 2, patterning using photolithography and Au-evaporating are performed so as to form the upper electrode 12t of the capacitor 12 and the DC bias supply wiring BP. At this time, the DC bias supply wiring BP is electrically connected to the inductor 14 of the spiral-shaped lower layer through the contact hole CH. See FIG. 4C. Depending on a semiconductor process, a metal forming the inductor 14 may be the same metal material as is used for the collector electrode 11c of the transistor 11. Therefore, a metal of the collector electrode 11c of the transistor 11, a metal of the lower electrode 12b of the capacitor 12, and a metal forming the inductor 14 may be the same.

On the other hand, in a case where the inductor 14 is formed of a two-layered spiral shape shown in FIG. 3, the DC bias supply wiring BP is formed so as to have a spiral shape through patterning using photolithography. See FIG. 4D. This can be easily achieved only by changing a mask for photolithography, which is used for forming the upper electrode 12t of the capacitor 12 and the DC bias supply wiring BP shown in FIG. 4C.

The inventor fabricated a power amplifier using the semiconductor integrated circuit apparatus of the aforementioned configuration and made an experiment. An effect that a measured noise was decreased by 3 dB in a reception band of the power amplifier, was able to be achieved. This effect was achieved by reducing an interference between a radio frequency signal and a DC bias of a bias circuit by using an inductor.

As described above, the semiconductor integrated circuit apparatus according to one embodiment of the present invention is able to minimize an amount of escape of an input radio frequency signal into a bias circuit. Thereby, a power amplifier of a reduced noise can be easily realized. Further, the lower electrode of the capacitor and the inductor are able to be formed in the same process, so that a semiconductor area is able to be reduced since no contact area is provided for connecting between the capacitor and the inductor, as compared to a case where a capacitor is formed separately from an inductor.

Figure 5:
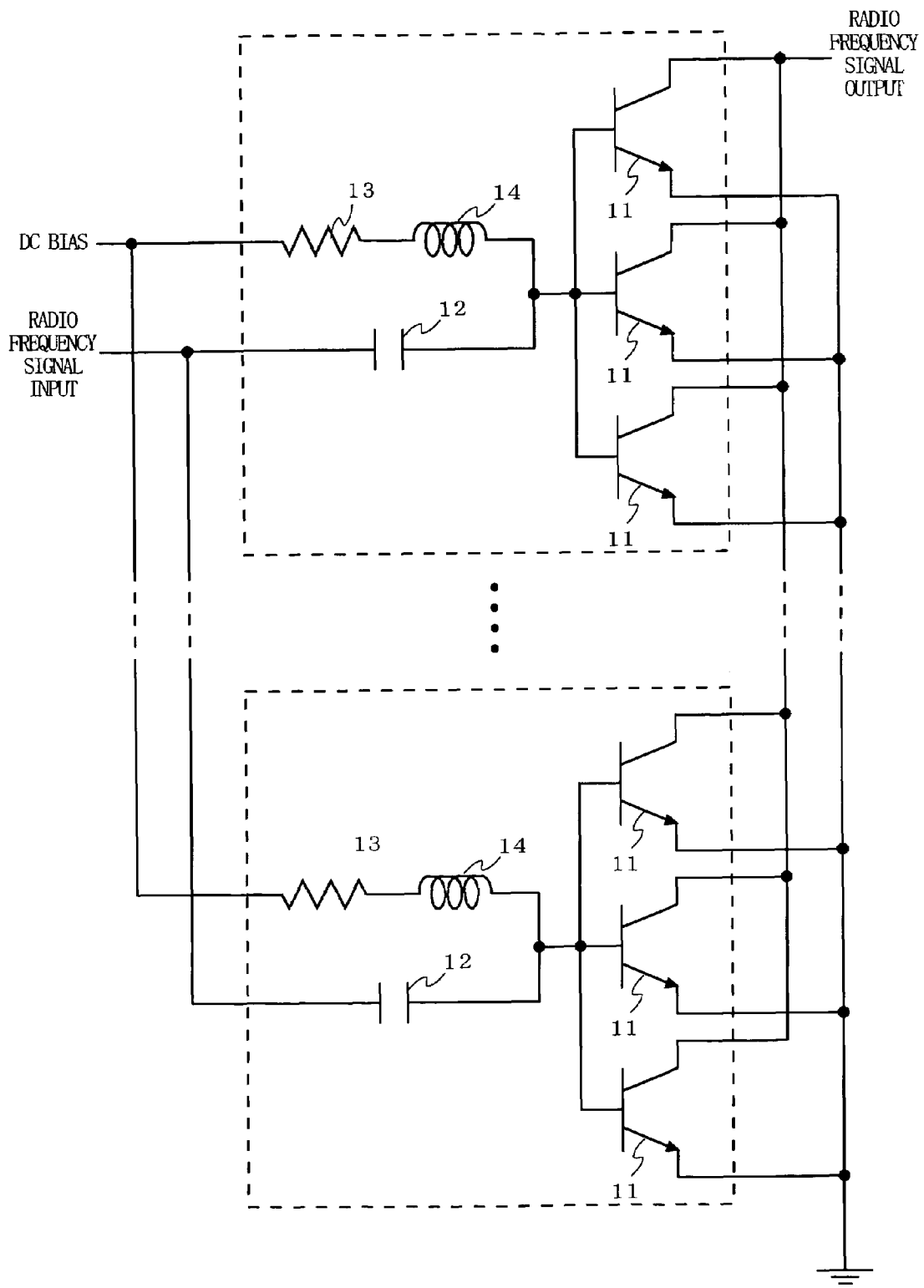
FIG. 5 is a diagram illustrating another configuration of the semiconductor integrated circuit apparatus 10 according to one embodiment of the present invention.
Figure 6:
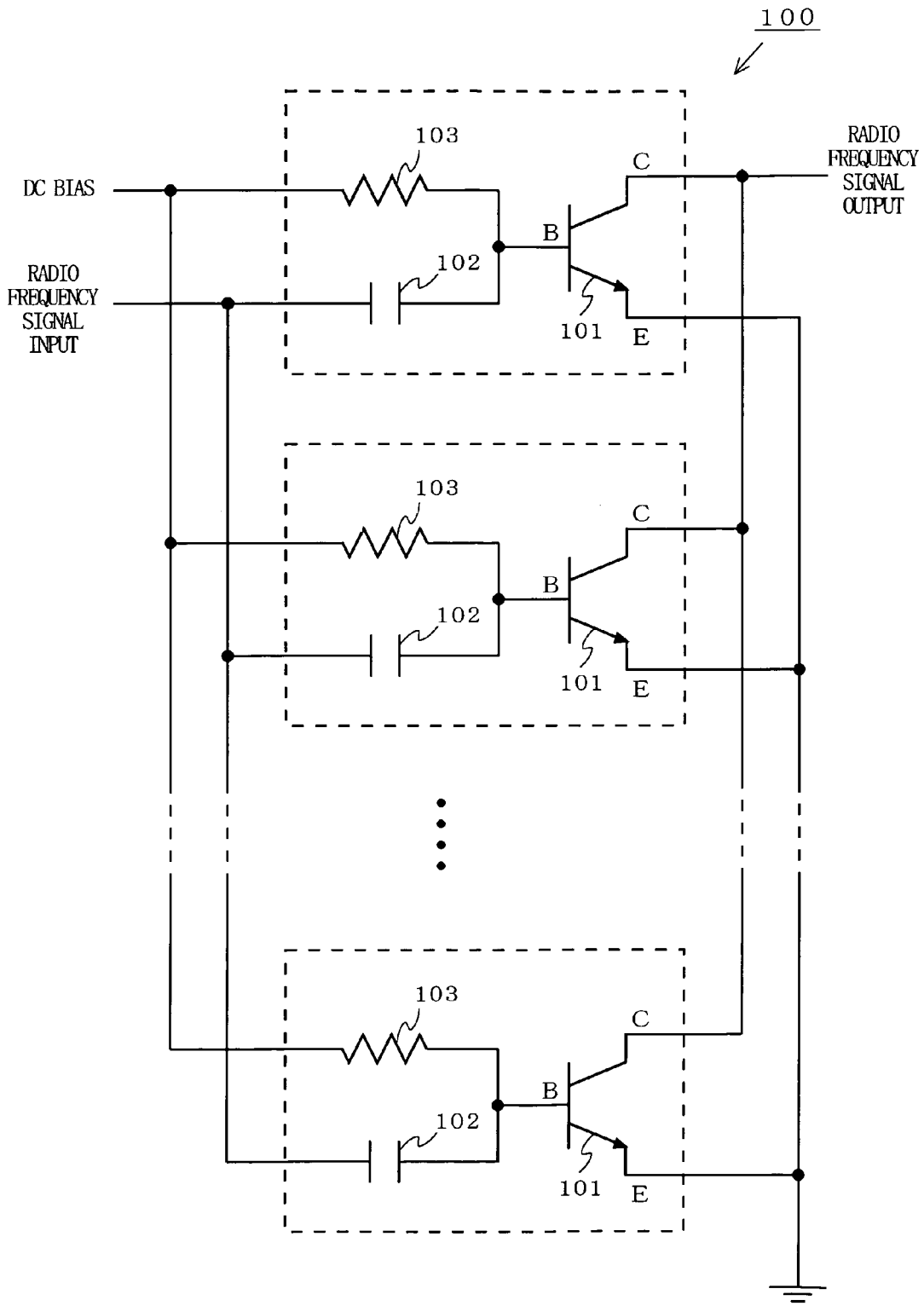
FIG. 6 is a diagram illustrating a configuration of a conventional semiconductor integrated circuit apparatus 100.

In the present embodiment, a cell circuit is configured such that each transistor 11 is connected to a capacitor 12, a resistor 13 and an inductor 14. However, in addition to this configuration, a cell circuit may be configured such that a plurality of transistors 11 are connected to a capacitor 12, a resistor 13, and an inductor 14, for example, as shown in FIG. 5. The number of transistors 11 is preferably 5 or less.

Further, in the present embodiment, described is an example where the resistor 13 and the inductor 14 are formed on a semiconductor substrate as different elements. In the semiconductor integrated circuit apparatus 10 of the present invention, however, any method for forming the resistor 13 may be used as long as the inductor 14 is formed so as to have a distinctive shape. For example, a wiring metal of a reduced film thickness functions as a sheet resistor, and the resistance value may be arbitrarily set according to a thickness and a width of the metal. Accordingly, the inductor 14 of a reduced film thickness having a spiral-shaped wiring may have an inductor component and a resistor component. In this case, a chip area is able to be reduced.

While the invention has been described in detail, the foregoing description is in all aspects illustrative and not restrictive. It is understood that numerous other modifications and variations can be devised without departing from the scope of the invention.

What is claimed is:

1. A semiconductor integrated circuit apparatus having at least one cell circuit integrated on a semiconductor substrate, wherein the cell circuit includes:
   at least one transistor;
   a capacitor having an electrode receiving an AC signal, having another electrode connected to a base of the transistor, and having a dielectric which is interposed between the electrode and said another electrode of the capacitor; and
   an inductor having a terminal to which a DC voltage is applied and having another terminal connected to the base of the transistor, wherein
   the inductor is formed of a spiral-shaped metal having two or more turns,
   the inductor is formed of a metal which is same as a metal of a collector electrode of the transistor and a metal of said another electrode of the capacitor, and
   said another terminal of the inductor is connected to the base of the transistor through said another electrode of the capacitor.

2. The semiconductor integrated circuit apparatus according to claim 1, further comprising a second inductor formed of a spiral-shaped metal having two or more turns and having such a turn direction as to conform a magnetic field direction thereof to a magnetic field direction of the inductor, the magnetic fields generated when a current flows, the second inductor formed in a layer other than a layer in which the inductor is formed, wherein
   the inductor and the second inductor cooperate with each other to generate a mutual inductance.

3. The semiconductor integrated circuit apparatus according to claim 2, wherein the second inductor is formed in a same process as is used for forming the electrode using a same metal material as the electrode of the capacitor.

4. The semiconductor integrated circuit apparatus according to claim 3, wherein
   the second inductor is formed of a metal which is same as a metal of a collector electrode of the transistor, and
   the cell circuit includes a plurality of transistors, and said another electrode of the capacitor and said another terminal of the inductor are commonly connected to each base of the plurality of transistors.

5. The semiconductor integrated circuit apparatus according to claim 2, wherein
   the second inductor is formed of a metal which is same as a metal of a collector electrode of the transistor, and
   the cell circuit includes a plurality of transistors, and said another electrode of the capacitor and said another terminal of the inductor are commonly connected to each base of the plurality of transistors.

6. The semiconductor integrated circuit apparatus according to claim 1, wherein the cell circuit includes a plurality of transistors, and said another electrode of the capacitor and said another terminal of the inductor are commonly connected to each base of the plurality of transistors.

7. The semiconductor integrated circuit apparatus according to claim 1, wherein
   the cell circuit includes a plurality of transistors, and said another electrode of the capacitor and said another terminal of the inductor are commonly connected to each base of the plurality of transistors.

* * * * *